(12) United States Patent
Tsai

(10) Patent No.: US 10,409,341 B2
(45) Date of Patent: Sep. 10, 2019

(54) COOLING APPARATUS

(71) Applicant: COOLER MASTER CO., LTD., New Taipei (TW)

(72) Inventor: Shui Fa Tsai, New Taipei (TW)

(73) Assignee: Cooler Master Co., Ltd., New Taipei (TW)

( * ) Notice: Subject to any disclaimer, the term of this patent is extended or adjusted under 35 U.S.C. 154(b) by 0 days.

(21) Appl. No.: 15/433,073

(22) Filed: Feb. 15, 2017

(65) Prior Publication Data

US 2017/0235350 A1      Aug. 17, 2017

Related U.S. Application Data

(60) Provisional application No. 62/295,149, filed on Feb. 15, 2016.

(51) Int. Cl.
*H01L 23/473* (2006.01)
*G06F 1/20* (2006.01)

(52) U.S. Cl.
CPC .............. *G06F 1/20* (2013.01); *H01L 23/473* (2013.01); *G06F 2200/201* (2013.01)

(58) Field of Classification Search
CPC .............. H01L 23/473; H05K 7/20254; H05K 7/20272
USPC .................. 165/80.4, 120; 361/699
See application file for complete search history.

(56) References Cited

U.S. PATENT DOCUMENTS

| 5,052,472 A | 10/1991 | Takahashi et al. |
| 6,054,676 A | 4/2000 | Wall et al. |
| 6,167,952 B1 | 1/2001 | Downing |
| 6,966,359 B1 | 11/2005 | Liu |
| 7,007,506 B2 | 3/2006 | Kubo et al. |
| 7,055,581 B1 * | 6/2006 | Roy ...................... H01L 23/427 165/104.21 |
| 7,240,722 B2 | 7/2007 | Lai et al. |

(Continued)

FOREIGN PATENT DOCUMENTS

| DE | 102011121064 A1 | 6/2013 |
| JP | S61-01819 A | 1/1986 |

(Continued)

OTHER PUBLICATIONS

Chinese Patent Application No. 201611132425.3 filed Dec. 9, 2016 with English translation.

(Continued)

*Primary Examiner* — Allen J Flanigan
(74) *Attorney, Agent, or Firm* — McDermott Will & Emery LLP

(57) ABSTRACT

A cooling apparatus that includes a base plate including two heat exchange units and a cover coupled to the base plate and enclosing the two heat exchange units. A recess is defined in the base plate and between the two heat exchange units. The cover and the base plate define a heat exchange chamber that includes the two heat exchange units. The cover has a first set of openings and a second set of openings, and is coupled to the base plate such that the first set of openings is above a first heat exchange unit and the second set of openings is above a second heat exchange unit. The cooling apparatus further includes a first pumping unit on the cover and over the first set of openings and a second pumping unit on the cover and over the second set of openings.

15 Claims, 15 Drawing Sheets

(56) References Cited

U.S. PATENT DOCUMENTS

| | | | |
|---|---|---|---|
| 7,249,625 B2* | 7/2007 | Duan | G06F 1/20 165/104.28 |
| 7,325,591 B2 | 2/2008 | Duan et al. | |
| 8,051,898 B2* | 11/2011 | Chiang | H01L 23/473 165/104.28 |
| 8,240,362 B2 | 8/2012 | Eriksen | |
| 8,245,764 B2 | 8/2012 | Eriksen | |
| 8,261,813 B2 | 9/2012 | Oikawa | |
| 8,746,330 B2 | 6/2014 | Lyon | |
| 9,345,169 B1 | 5/2016 | Campbell et al. | |
| 9,441,640 B2 | 9/2016 | Park et al. | |
| 9,795,058 B2* | 10/2017 | Tsai | G06F 1/20 |
| 2004/0130874 A1* | 7/2004 | Maveety | H01L 23/42 361/699 |
| 2005/0241806 A1 | 11/2005 | Liu | |
| 2006/0185378 A1* | 8/2006 | Duan et al. | H05K 7/20263 62/259.2 |
| 2006/0225867 A1 | 10/2006 | Park et al. | |
| 2008/0029260 A1 | 2/2008 | Hu et al. | |
| 2009/0101316 A1 | 4/2009 | Han et al. | |
| 2009/0159244 A1 | 6/2009 | Mounioloux | |
| 2009/0284921 A1* | 11/2009 | Colgan | H01L 23/473 361/699 |
| 2012/0152498 A1 | 6/2012 | Lyon | |
| 2012/0175094 A1 | 7/2012 | Rice | |
| 2013/0008628 A1 | 1/2013 | Tiengtum et al. | |
| 2013/0051108 A1 | 2/2013 | Nagao et al. | |
| 2015/0021756 A1 | 1/2015 | Adachi | |
| 2016/0309618 A1 | 10/2016 | Tsai et al. | |
| 2016/0338223 A1 | 11/2016 | Tsai et al. | |
| 2016/0363967 A1 | 12/2016 | Tsai | |
| 2017/0045300 A1 | 2/2017 | Boday | |
| 2017/0045306 A1 | 2/2017 | Tsai | |
| 2017/0045307 A1 | 2/2017 | Tsai | |
| 2017/0118870 A1 | 4/2017 | Yin et al. | |
| 2017/0192471 A1 | 7/2017 | Tsai et al. | |
| 2017/0235350 A1 | 8/2017 | Tsai | |
| 2018/0139865 A1 | 5/2018 | Draht et al. | |
| 2018/0213677 A1 | 7/2018 | Wu et al. | |
| 2018/0259267 A1 | 9/2018 | Tsai et al. | |
| 2018/0332734 A1 | 11/2018 | Bandorawalla et al. | |
| 2018/0340744 A1 | 11/2018 | Tsai et al. | |

FOREIGN PATENT DOCUMENTS

| | | |
|---|---|---|
| KR | 10-0529825 B1 | 11/2005 |
| TW | M278938 U | 10/2005 |
| TW | M311234 U | 5/2007 |

OTHER PUBLICATIONS

Chinese Patent Application CN 201511023351.5 filed Dec. 30, 2015 with English translation.

Final Office Action issued in U.S. Appl. No. 14/988,753, dated Jan. 11, 2019 (available via USPTO PAIR System).

Non-Final Office Action issued in U.S. Appl. No. 14/988,753, dated Aug. 8, 2018 (available via USPTO PAIR System).

Final Office Action issued in U.S. Appl. No. 14/988,753, dated Jan. 16, 2018 (available via USPTO PAIR System).

Non-Final Office Action issued in U.S. Appl. No. 14/988,753, dated Jul. 31, 2017 (available via USPTO PAIR System).

Non-Final Office Action issued in U.S. Appl. No. 15/395,954, dated Feb. 15, 2019 (available via USPTO PAIR System).

* cited by examiner

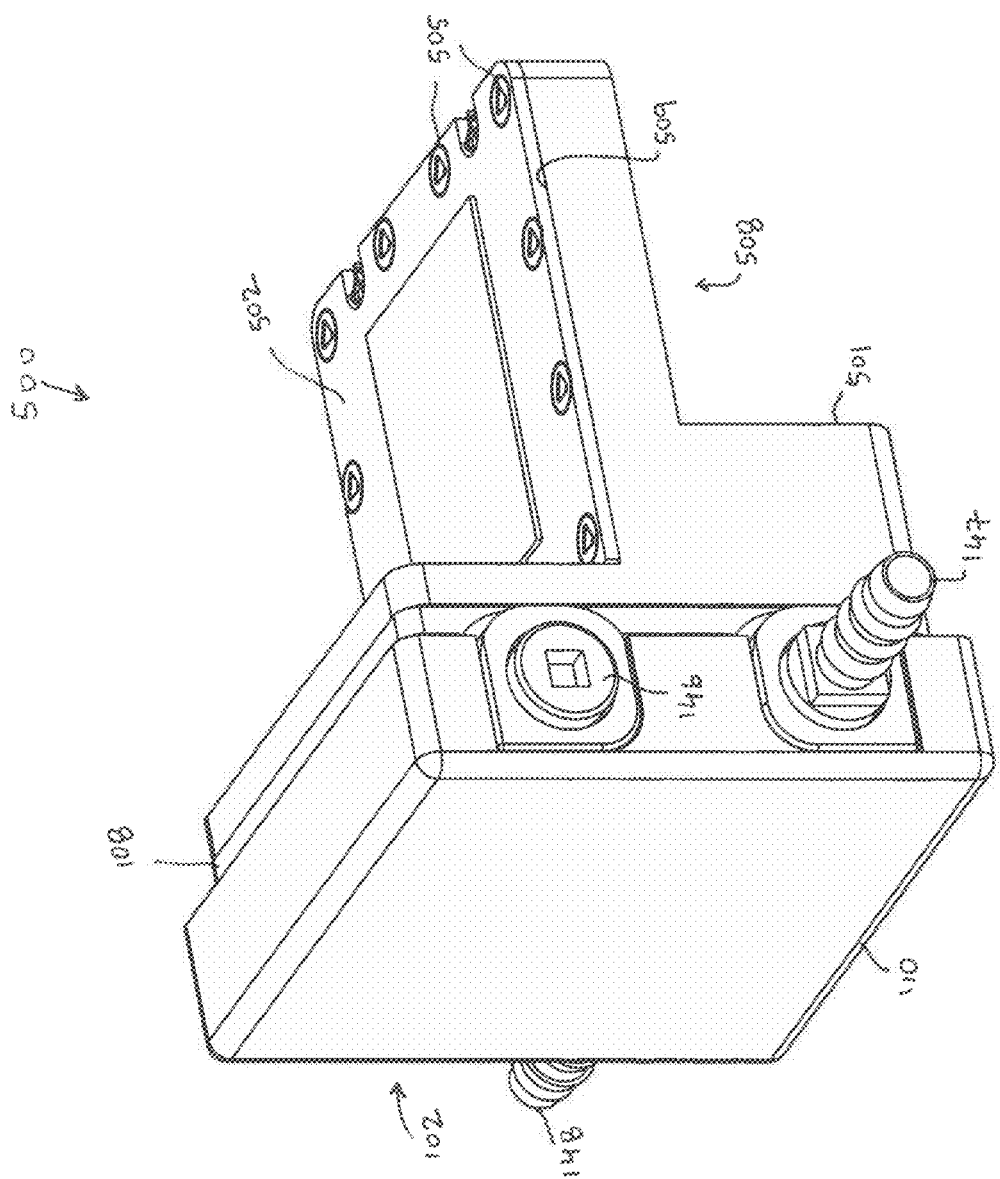

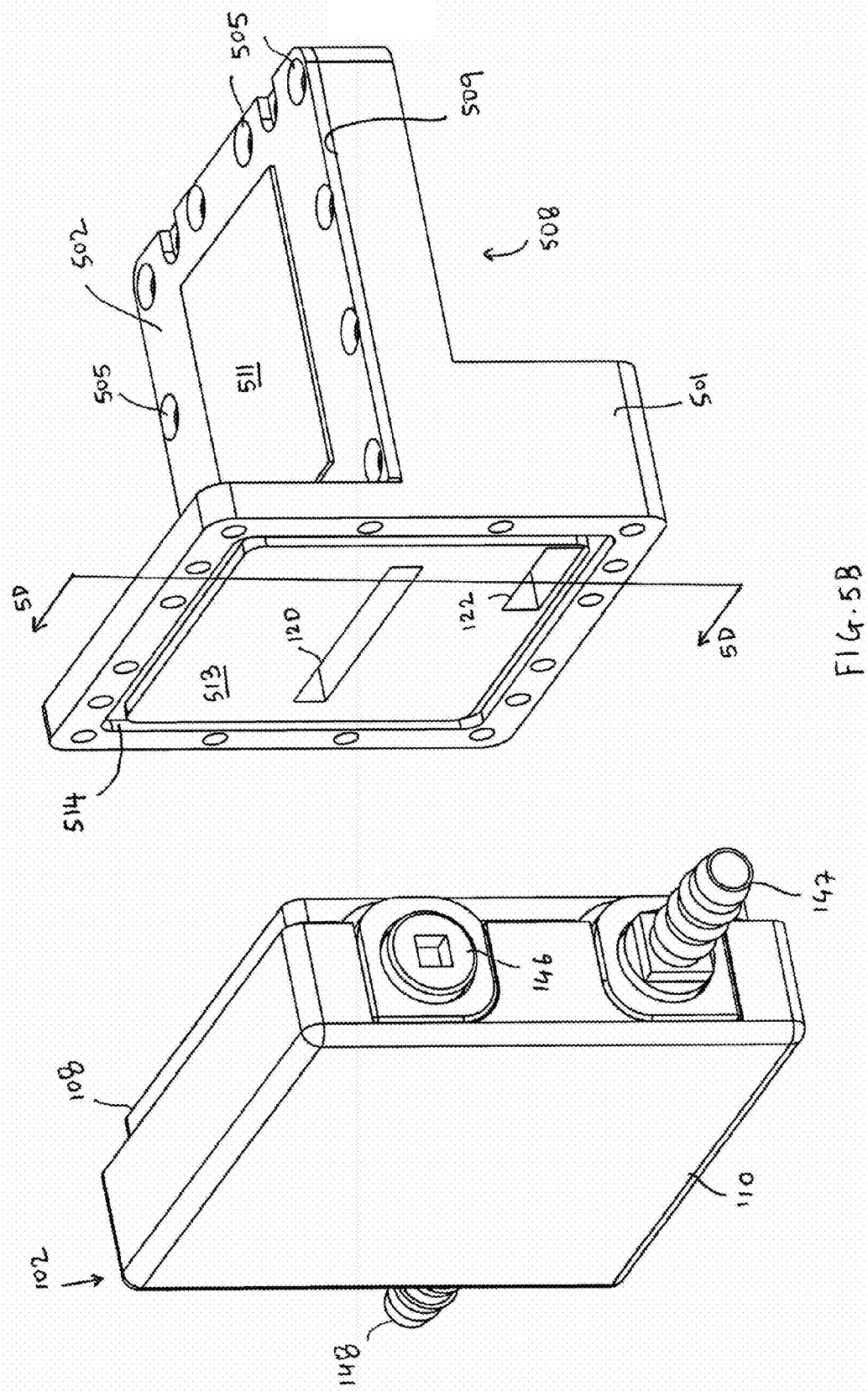

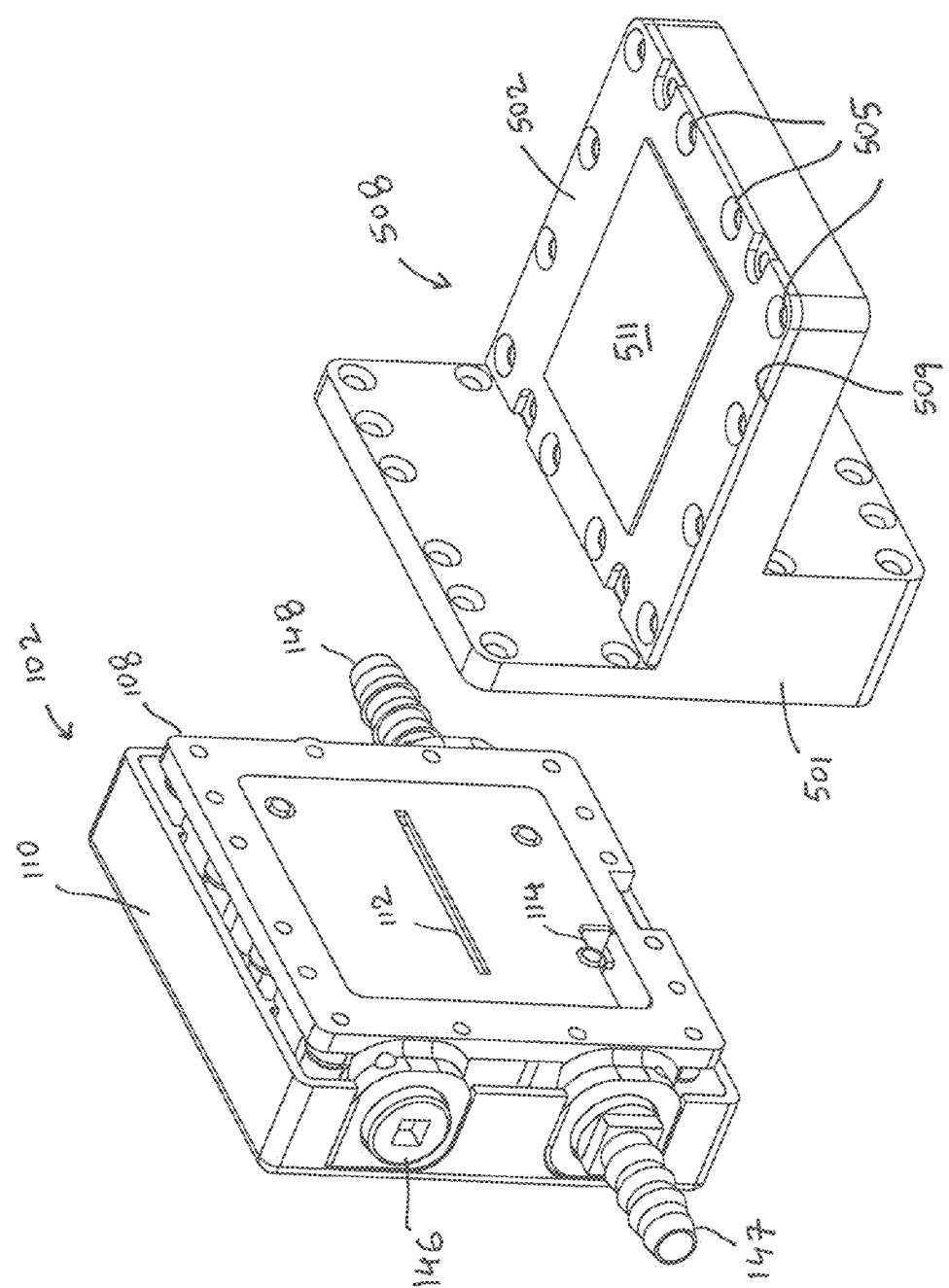

COOLING APPARATUS

CROSS-REFERENCE TO RELATED APPLICATIONS

This non-provisional application claims priority under 35 U.S.C. § 119 to provisional application 62/295,149 filed Feb. 15, 2016, in the US Patent and Trademark Office (USPTO), the contents of this application being incorporated herein by reference in their entirety.

BACKGROUND

Field

Embodiments disclosed are related to heat dissipation using fluid, and more particularly, to a cooling apparatus device using a circulating cooling fluid that dissipates heat generated by a computing.

Description of Related Art

With the increase of the processing speed and performance of electronic components, such as central processing units (CPU), the amount of heat generated during operation of the electronic component increases. The heat generation increases the temperature of the electronic component and, if the heat cannot be dissipated effectively, reliability and performance of the electronic component are reduced. To prevent overheating of an electronic component, typically, a water cooling apparatus is used for cooling the electronic component and, thereby maintaining normal operation of the electronic component.

Existing fluid cooling apparatuses typically include a base plate of a heat exchange chamber attached to a CPU, and the heat exchange chamber is fluidly connected to a fluid circulating pump. The pump circulates the fluid inside the heat exchange chamber in order to deliver the fluid at lower temperature to the heat exchange chamber. As the fluid circulates in the heat exchange chamber, thermal energy is exchanged between the base plate and the fluid and, as a result, the temperature of the base plate is reduced and the temperature of the fluid increases. However, the existing heat exchange chambers are often of complicated structures and this causes a reduction in the heat transfer efficiency.

Also, existing fluid cooling apparatuses cannot dissipate heat from more than one electronic component at a time, and they occupy a relatively large space.

SUMMARY

Various aspects of the present disclosure provide a cooling apparatus for dissipating heat generated by electronic components.

According to one aspect of the present disclosure, the cooling apparatus includes a base plate configured to dissipate heat and including two heat exchange units and a cover coupled to the base plate and enclosing the two heat exchange units. At least one recess is defined in the base plate and between the two heat exchange units. The cover and the base plate define therebetween a heat exchange chamber that includes the two heat exchange units. The cover has a first set of openings and a second set of openings, and is coupled to the base plate such that the first set of openings is above a first heat exchange unit and the second set of openings is above a second heat exchange unit. The cooling apparatus further includes a first pumping unit disposed on the cover and over the first set of openings and a second pumping unit disposed on the cover and over the second set of openings. Each of the first and second pumping units circulates fluid into and out of the heat exchange chamber.

According to another aspect of the present disclosure, the cooling apparatus includes a cooling unit including a body having a vertical surface and a horizontal surface perpendicular to the vertical surface. The vertical surface of the body has first and second openings, and the horizontal surface has a cavity in fluid communication with the first and second openings. The cooling apparatus further includes a heat sink device disposed in the cavity and a pumping unit coupled to the cooling unit via the vertical surface and configured to circulate fluid into and out of the cooling unit.

According to another aspect of the present disclosure, a method of operating a cooling apparatus includes receiving fluid into a first pumping unit and a second pumping unit via corresponding inlets of the first pumping unit and the second pumping unit. Each pumping unit is disposed on a cover coupled to a base plate, the base plate includes two heat exchange units and contains at least one recess between the two heat exchange units, the cover is coupled to the base plate, and a heat exchange chamber is defined between the cover and the base plate and includes the two heat exchange units. The cover contains a first set of openings and a second set of openings, and is coupled to the base plate such that the first set of openings is above a first heat exchange unit and the second set of openings is above a second heat exchange unit. A first pumping unit is disposed over the first set of openings and a second pumping unit is disposed over the second set of openings. The method further includes transferring the fluid into the heat exchange chamber via the first and second sets of openings, transferring the fluid into the first pumping unit and the second pumping unit, and outputting the fluid from the first pumping unit and the second pumping unit via corresponding outlets of the first pumping unit and the second pumping unit.

According to one aspect of the present disclosure, the cooling apparatus includes a cooling unit having a base plate configured to dissipate heat and including at least one heat exchange unit, and a cover coupled to the base plate and enclosing the at least one heat exchange unit. The cover has a first surface that is substantially flat and includes a first opening and a second opening. The cooling apparatus also includes a pumping unit coupled to the cooling unit and over the first and second openings. The pumping unit includes a second surface that is substantially flat and contains a third opening and a fourth opening, the pumping unit is coupled to the cooling unit via the second surface and the first surface of the cover such that the third opening is in fluid communication with the first opening and the fourth opening is in fluid communication with the second opening, and the pumping unit is configured to output a low temperature fluid to the cooling unit and receive a high temperature fluid from the cooling unit. The cooling apparatus further includes a sealing element is disposed between the cooling unit and the pumping unit, and the sealing element surrounds the first, second, third, and fourth openings

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

FIG. 5A is a perspective view of still another embodiment of a cooling apparatus.

FIGS. 5B and 5C are different perspective views of the cooling apparatus of FIG. 5A in a disassembled state.

DETAILED DESCRIPTION

Embodiments described herein are directed to a cooling apparatus that can dissipate heat generated from multiple heat generating sources and thereby increase heat transfer efficiency. Embodiments disclosed are also directed to a cooling apparatus that occupies a reduced space compared to prior art cooling apparatuses.

Figure 1A:
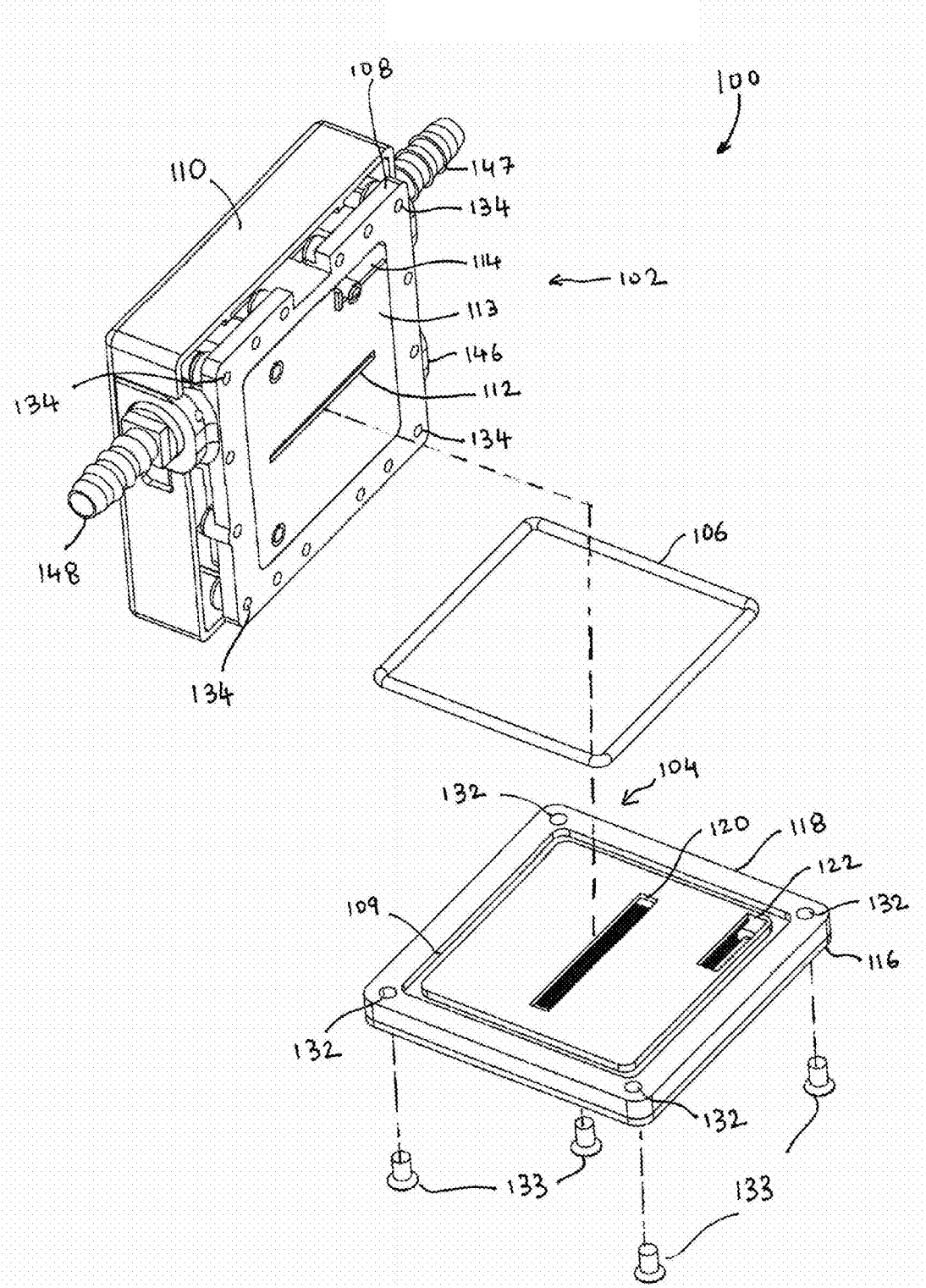
FIG. 1A illustrates an exploded view of a cooling apparatus, according to disclosed embodiments.

FIG. 1A is an exploded view of a cooling apparatus 100, according to embodiments disclosed herein. As illustrated, the cooling apparatus 100 includes a pumping unit 102 that is disposed on a cooling unit 104. The pumping unit 102 includes a pump housing 108 and a casing 110 sized or otherwise configured to receive the pump housing 108 therein. Although not explicitly illustrated, a pump for circulating fluid between the pumping unit 102 and the cooling unit 104 may be disposed in the pump housing 108. The operating speed of the pumping unit 102 may be based on or otherwise related to the rotational speed of the pump. The pump housing 108 includes inlets 146 and 148 via which the fluid enters the pumping unit 102 and an outlet 147 via which the fluid exits the pumping unit 102. In an embodiment, the inlets 146, 148 can be used selectively, and any unused inlet may be plugged. For instance, in FIG. 1A, the inlet 146 is plugged.

The fluid may be circulated between the pumping unit 102 and the cooling unit 104 via a first opening 112 and a second opening 114 defined in the pump housing 108. Briefly, during operation, fluid may enter the pumping unit 102 via the inlets 146 and/or 148 and then flow into the cooling unit 104 via the first opening 112. The fluid may then enter the pumping unit 102 via the second opening 114 and exit the pumping unit 102 via the outlet 147. The first and second openings 112 and 114 are not limited to having any particular shape, and the first and second openings 112 and 114 may be elongated slots, square, circular, polygonal, or of any desired shape, and may have any desired size, without departing from the scope of the disclosure.

The cooling unit 104 may include a base plate 116 and a cover 118 that is sized or otherwise configured to receive the base plate 116. As illustrated, the cover 118 defines a first opening 120 and a second opening 122. The first and second openings 120 and 122 may correspond to the openings 112 and 114 defined in the pump housing 108. In order to provide efficient fluid transfer between the pumping unit 102 and the cooling unit 104, the first and second openings 120 and 122 may have the same shape and size as the openings 112 and 114 defined in the pump housing 108. Further, the opening 120 and 122 may be sized and shaped such that the opening 112 coincides with the opening 120, and the opening 114 coincides with the opening 122 when the pumping unit 102 is positioned on the cooling unit 104.

Thus, as illustrated, the first and second openings 120 and 122 may be shaped as elongated slots extending parallel to each other in the top plate 11, and the first opening 120 may be longer than the second opening 122. However, the openings 120 and 122 may be square, circular, polygonal, or of any shape and size as the openings 112 and 114, without departing from the scope of the disclosure.

A sealing element 106 (e.g., a gasket, an O-ring, a washer, and the like) may be disposed at an interface between the pumping unit 102 and the cooling unit 104 to prevent fluid that flows between the pumping unit 102 and the cooling unit 104 from leaking out of the cooling apparatus 100.

Figure 1B:
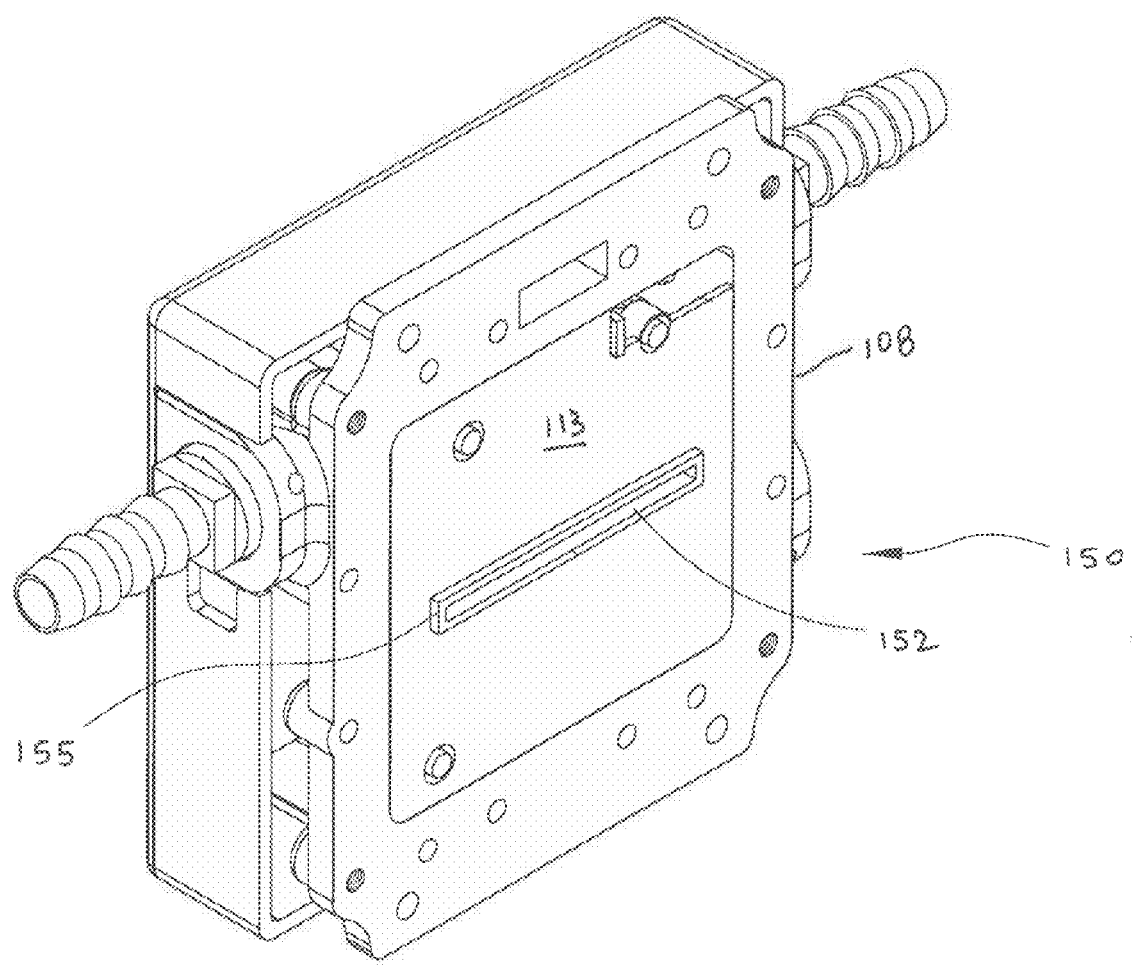
FIG. 1B illustrates a prior art pumping unit having a flange at an opening therein.

FIG. 1B illustrates a prior art pumping unit 150 having a flange 155 at the opening 152. The pumping unit 150 may be installed in the cooling unit 104 (FIG. 1A) and the flange 155 may guide the fluid from the pumping unit 150 into the cooling unit 104 via the opening 120. The flange 155 may be shaped and sized to fit into the opening 120 when the pumping unit 102 is installed on the cooling unit 104. The flange 155 may ensure a correct placement of the pumping unit 102 when installed on the cooling unit, and thereby minimize leakage. However, due to the presence of the flange 155, it is not possible to use the pumping unit 150 with other cooling units having openings that are not sized or otherwise configured to receive the flange 155. This limits the use of the pumping unit 150. The pumping unit 102, according to embodiments disclosed herein, does not include the flange and thus may be used with a variety of cooling units. Because the flange is absent, the bottom surface 113 of the pump housing 108 may be considered to be substantially flat or planar. Specifically, the bottom surface 113 may be substantially flat between the openings 112 and 114, and between the openings 112 and 114 and the peripheral edges of the housing 108.

Figure 2A:
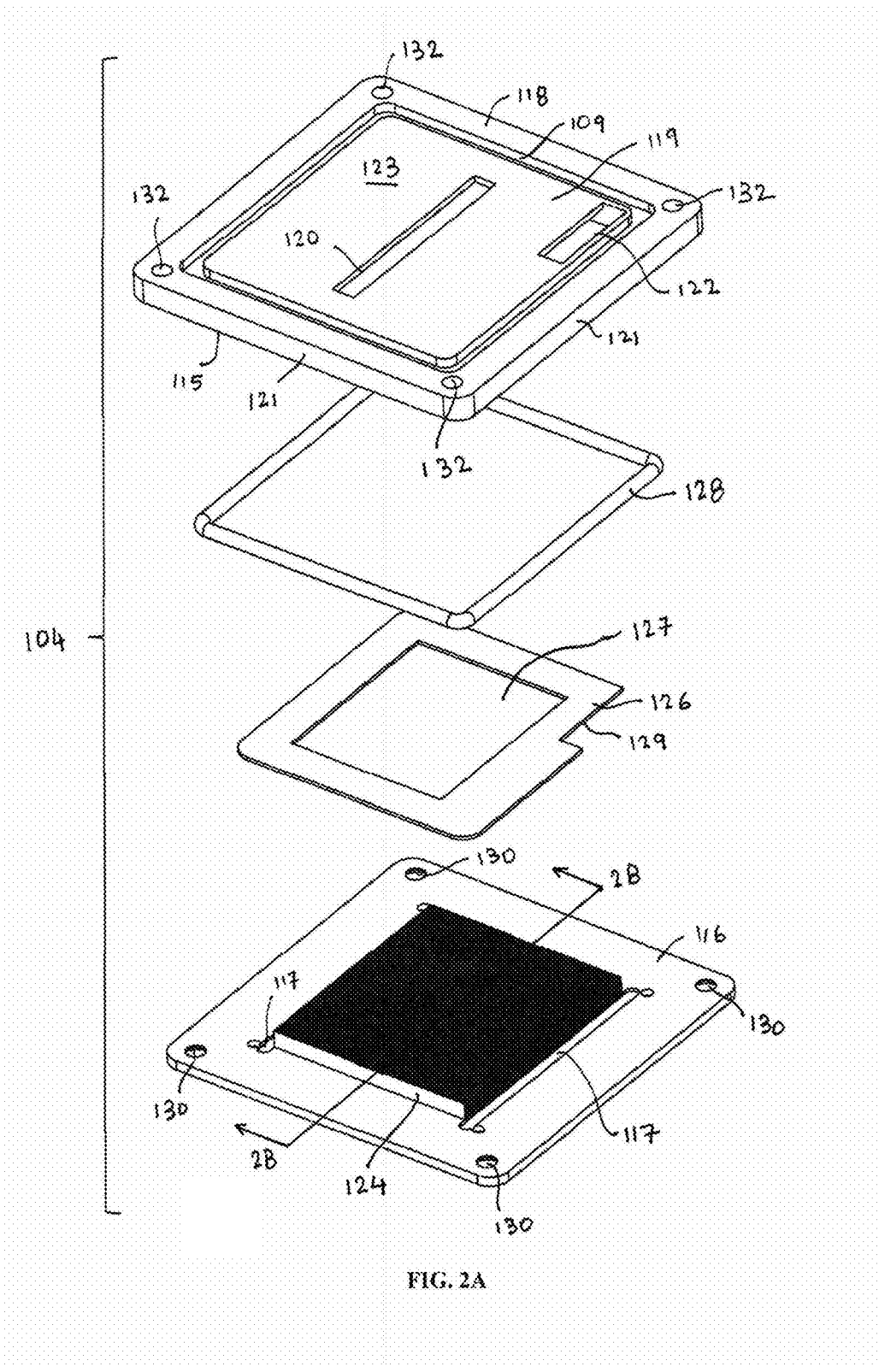
FIG. 2A illustrates an exploded view of the cooling unit of FIG. 1A, according to disclosed embodiments.

FIG. 2A illustrates an exploded view of the cooling unit 104, according to embodiments disclosed herein. As illustrated, the cover 118 includes a top plate 119 having peripheral sidewalls 121 disposed at an edge thereof. The top plate 119 may be generally rectangular or square in shape and the sidewalls 121 may be disposed along the entire periphery of the top plate 119. The top plate 119 and the sidewalls 121 together define or otherwise enclose a space 115. As illustrated, the openings 120 and 122 may be formed in a top surface 123 of the top plate 119 and the openings 120 and 122 are in fluid communication with the space 115. The top surface 123 may also be substantially flat between the openings 120 and 122, and between the openings 120 and 122 and the peripheral sidewalls 121. Referring to FIGS. 1A and. 2A, the pumping unit 102 and the cooling unit 104 are coupled to each other via two substantially flat surfaces 113 and 123, and the sealing element 106 disposed therebetween and surrounding the openings 112, 114, 120, and 122. More specifically, the sealing element 106 may be disposed in a recess 109 defined in the surface 123. When the pumping unit 102 and the cooling unit 104 are coupled to each other, the openings 112 and 120 are in fluid communication with each other and the openings 114 and 122 are in fluid communication with each other. In an example, when the pumping unit 102 and the cooling unit 104 are coupled to each other, the openings 112 and 120 (or more specifically, the edges thereof) coincide with each other and the openings 114 and 122 (or more specifically, the edges thereof) coincide with each other.

The base plate 116 may include a heat exchange unit disposed on a side of the base plate 116. In an embodiment and as illustrated, the heat exchange unit may be or include an array of a plurality of fins 124. However, in other embodiments, the heat exchange unit may be or include pins, columns, or any other structure of a desired shape and size for dissipating heat, without departing from the scope of the disclosure. Although not illustrated, an electronic component from which heat is to be dissipated is coupled to a side of the base plate 116 opposite the side including the heat exchange unit. The base plate 116 (or at least a portion thereof) includes a thermally conductive material, such as a metal including copper, aluminum etc., or non-metal thermally conductive material, such as graphite etc. The fins 124 (or at least a portion thereof) may also include a thermal conductive material. In an embodiment, the fins 124 and the base plate 116 may be integrally formed as a single piece. In another embodiment, the fins 124 may be coupled to the base plate 116 using known techniques.

Figure 2B:
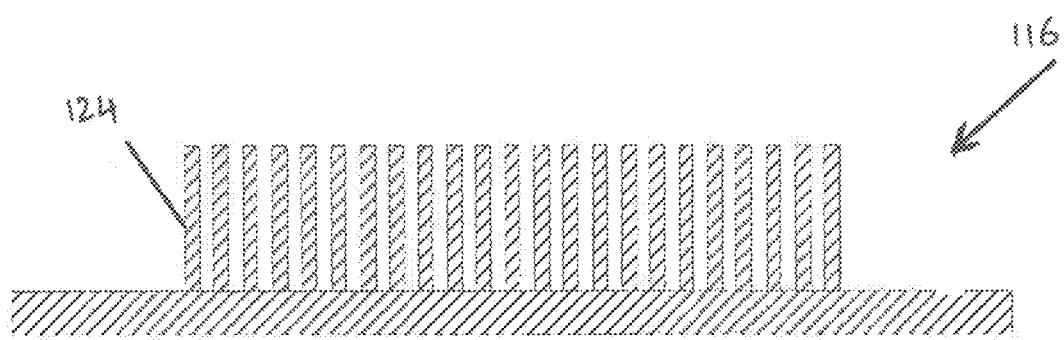
FIG. 2B illustrates a cross-sectional view of the base plate of FIG. 2A taken along the line 2B-2B, according to disclosed embodiments.

Referring briefly to FIG. 2B, illustrated is a cross-sectional view of the base plate 116 taken along the line 2B-2B, according to embodiments disclosed herein. As illustrated, the fins 124 extend transversely on the base plate 116 along the length (or width) thereof, and are arranged parallel to each other and perpendicular to the base plate 116. However, in other embodiments, some or all of the fins 124 may be non-parallel to each other and may be arranged on the base plate 116 at an angle less than 90°. The array of fins 124 may occupy a generally central portion of the base plate 116.

Returning to FIG. 2A, the base plate 116 may define recesses 117 adjacent and in fluid communication with the array of fins 124 and on opposite sides thereof. As illustrated, the recesses 117 may extend perpendicular to the fins 124. The recesses 117 may collect and/or guide the fluid along the array of fins 124.

The cooling unit 104 may also include a pad 126 that may be positioned on the base plate 116. The pad 126 may be positioned on the base plate 116 between the fins 124 and the cover 118 (or more specifically, the sidewalls 121 of the cover 118) when the cover 118 is installed on the base plate 116. The pad 126 defines a through hole 127 located centrally in the pad 126 and a notch 129 on a side of the pad 126. The through hole 127 is sized to receive the plurality of fins 124, and the notch 129 prevents the pad 126 from obstructing the second opening 122 of the cover 118 when the cover is installed on the base plate 116. The pad 126 may occupy the space between the cover 118 and the fins 124 and may prevent leakage of fluid.

The cooling unit 104 may also include a sealing element 128, such as a gasket, O-ring, washer, and the like. When the cooling unit is assembled, the sealing element 128 may be positioned around the pad 126 and between the pad 126 and the cover 118 to further prevent leakage of fluid.

When the cooling unit 104 is assembled by positioning the cover 118 on the base plate 116, the array of fins 124, the pad 126, and the sealing element 128 are received in the space 115. The top plate 119, the sidewalls 121, and the base plate 116 cooperatively define a heat exchange chamber. The cover 118 may be welded to the base plate 116 to secure the cover 118 to the base plate 116. The welding is not limited to any specific type of welding and the cover 118 may be welded to the base plate 116 using any suitable type of welding, without departing from the scope of the disclosure. Other fastening techniques, such as riveting, screwing, press-fitting, and the like, fasteners, such as rivets, screws, nuts, bolts, etc., may be used to secure the cover 118 to the base plate 116.

The base plate 116 may be positioned on the cover 118 such that the first opening 120 is positioned over the fins 124 (or any other heat exchange unit used). Referring to FIGS. 1A and 2A, the base plate 116 may be positioned such that the fins 124 extend in a direction perpendicular to the direction in which the first opening 120 and the second opening 122 extend. Stated otherwise, the fins 124 extend in a direction from the first opening 120 to the second opening 122. The base plate 116 is attached to an electronic component (e.g., a central processing unit (CPU)) from which heat is to be dissipated. Specifically, and as mentioned above, the electronic component from which heat is to be dissipated is attached to the bottom surface (e.g., the surface of the base plate 116 opposite to the surface having the fin 124) using a thermally conductive material (e.g., thermal grease) in order to transfer the heat generated from the electronic component to the base plate 116.

The base plate 116 and the cover 118 may define installation holes 130 and 132, respectively, at the corners thereof. Referring to FIG. 1A, installation holes 134 may also be defined in the pump housing 108. The installation holes 130, 132, and 134 may receive fasteners, such as rivets, screws, nuts, bolts, etc. to secure the pumping unit 102 to the cooling unit 104. In an example, and as illustrated in FIG. 1A, screws 133 are used to secure the pumping unit 102 and the cooling unit 104 together.

Figure 3A:
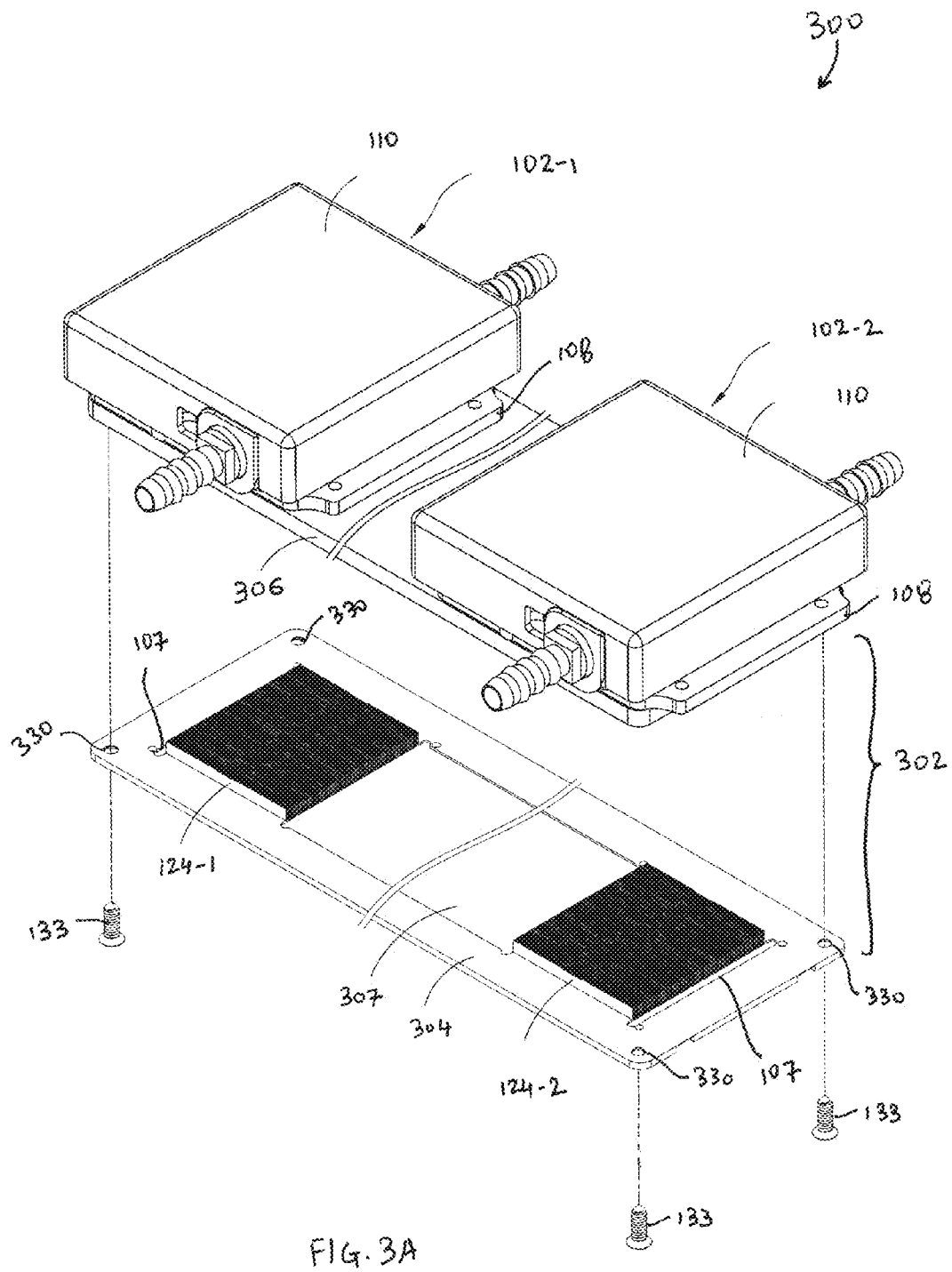
FIG. 3A illustrates a partially exploded view of another embodiment of a disclosed cooling apparatus.

FIG. 3A is a partially exploded view of a cooling apparatus 300, according to embodiments disclosed herein. As illustrated, the cooling apparatus 300 may include two pumping units 102 (labelled as 102-1 and 102-2) of FIG. 1A disposed on a cooling unit 302, shown in exploded view. Although two pumping units 102 are illustrated in FIG. 3A, greater than two pumping units 102 can be included in the cooling apparatus 300, without departing from the scope of the disclosure.

The cooling unit 302 may be similar in some respects to the cooling unit 104 in FIG. 1A, and therefore may be best understood with reference thereto where like numerals designate like components not described again in detail. Unlike the cooling unit 104, the cooling unit 302 may be a generally rectangular structure having the two pumping units 102 disposed on it. In an example, and as illustrated, two pumping unit 102 may be disposed at opposite ends of the cooling unit 302. It will be understood that the cooling unit 302 is not limited to having any particular shape and size, and the cooling unit 302 may have desired shape and size based on, for instance, the application and the number of pumping units 102 disposed on the cooling unit 302, without departing from the scope of the disclosure.

The cooling unit 302 may include a base plate 304 having two arrays of fins 124 (labelled as 124-1 and 124-2) disposed at opposite ends thereof, and a cover 306 that is sized or otherwise configured to receive the base plate 304. The cover 306 may define two sets of openings 120 and 122 (FIG. 1A), each at an end of the cover 306. One set of openings 120 and 122 may be located above the array of fins 124-1 and the other set of openings 120 and 122 may be located above the array of fins 124-2. Each pumping unit 102 may be positioned on the cover 306 and on a set of openings 120 and 122.

Recesses 107 may be at the two opposite ends of the base plate 304 with each recess 107 being in fluid communication with an adjacent array of fins 124-1 or 124-2. As illustrated, a recess 307 may also be defined in the base plate 304 between the arrays of fins 124-1 and 124-2. The recess 307 may be in fluid communication with the arrays of fins 124-1 and 124-2. A separating wall or a ridge 308 may divide the recess 307 into two flow channels 309-1 and 309-2 that are fluidly isolated from each other. As discussed below, cool fluid may be exchanged between the arrays of fins 124-1 and 124-2 via the flow channels 309-1 and 309-2 during operation of the cooling apparatus 300.

The base plate 304 may have installation holes 330 at the corners thereof. Corresponding installation holes (not illustrated) may be provided in the pump housing 108 and the cover 306, as discussed above with reference to FIG. 2A. The cooling unit 302 may be secured to each pumping unit 102 using screws 133 received in the installation holes. However, other kinds of fasteners, such as rivets, nuts, bolts, etc. may also be used to secure the pumping unit 102 and the cooling unit 104 together. In the illustrated embodiment, the sealing element 128 and pad 126 may be omitted from the cooling unit 302. However, in other embodiments the pad 126 and the sealing element 128 may be included in the cooling unit 302, and may be sized or otherwise configured to operate in the cooling unit 302 without restricting the fluid flow between the arrays of fins 124-1 and 124-2.

Figure 3B:
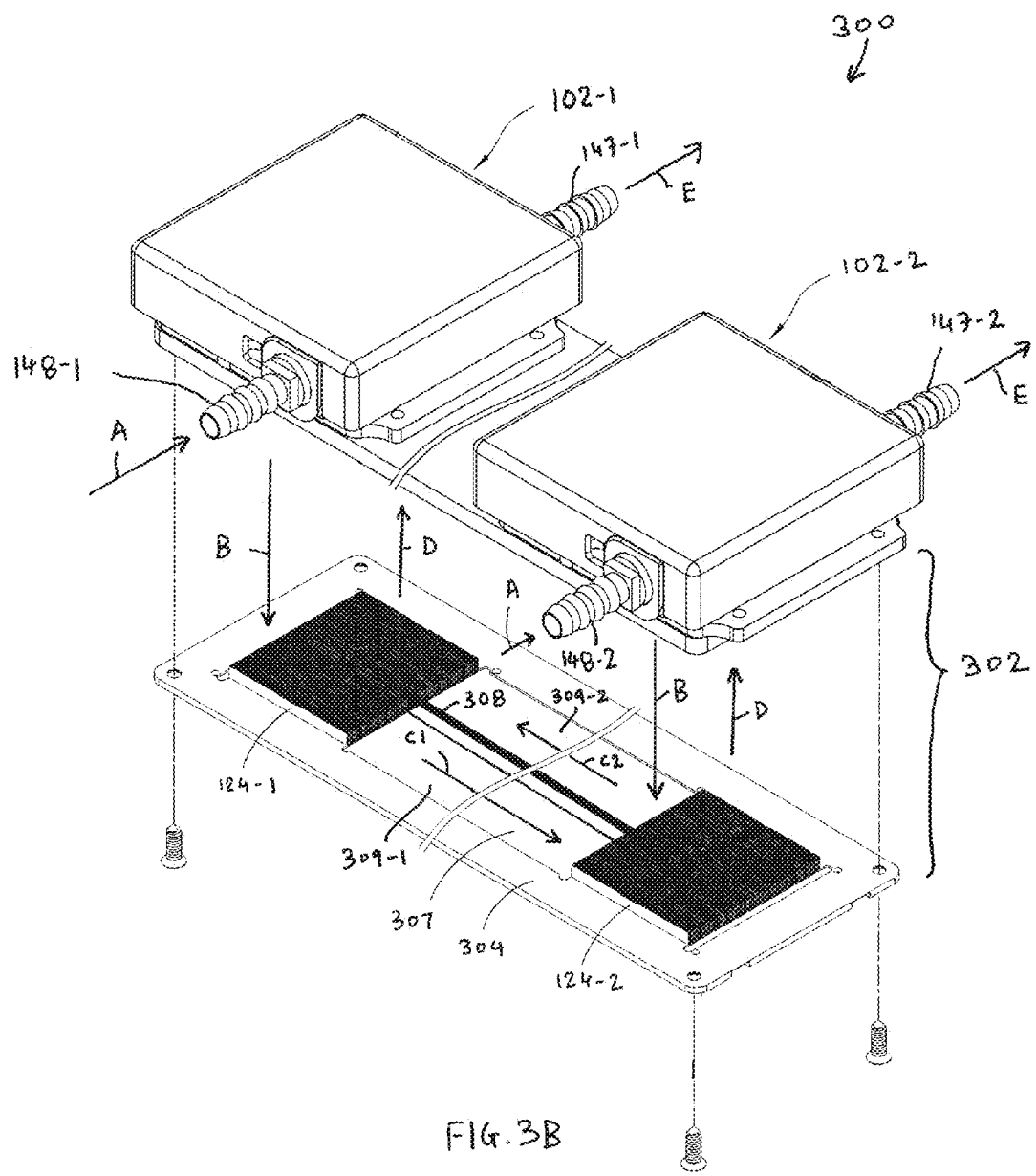
FIG. 3B illustrates a fluid flow in the cooling apparatus of FIG. 3A during operation thereof, according to disclosed embodiments.

FIG. 3B illustrates fluid flow in the cooling apparatus 300 during operation thereof, according to embodiments disclosed herein. For the sake of clarity of illustration, not all components of the cooling apparatus 300 are labelled in FIG. 3B. Each pumping unit 102 may be connected to an individual external heat dissipating device (e.g., a radiator or similar device) or the two pumping unit 102 may share a common external heat dissipating device. Fluid may be circulated between the cooling apparatus 300 and the external heat dissipating device(s). In an example, the inlets 148 (labelled as 148-1 and 148-2) of the pumping units 102 (102-1 and 102-2) may be connected to an outlet of the external heat dissipating device (not expressly illustrated), and the outlets 147 (labelled as 147-1 and 147-2) may be connected to an inlet of the external heat dissipating device.

During operation, relatively cooler fluid from the external heat dissipating device may enter the pumping units 102 via the respective inlets 148-1 and 148-2, as indicated by the arrows A. The cooler fluid may enter the cooling unit 302 and is exposed to the arrays of fins 124-1 and 124-2, as indicated by the arrows B. Inside the cooling unit 302, heat from the base plate 304 and the fins 124 is transferred to the cooler fluid and the temperature of the cooler fluid increases.

The heated fluid (or at least a portion thereof) from the array of fins 124-1 flows to the array of fins 124-2 via the channel 309-1, as indicated by the arrow C1. Similarly, the heated fluid (or at least a portion thereof) from the array of fins 124-2 flows to the array of fins 124-1 via the channel 309-2, as indicated by the arrow C2. By exchanging fluid between the fins 124 additional heat may be dissipated from the base plate 304 and the fins 124, heat transfer efficiency may be increased. The heated fluid may enter the pumping units 102, as indcted by arrows D, and may exit the corresponding pumping units 102 via the outlets 147-1 and 147-2, as indicated by the arrows E. The heated fluid then flows to the external heat dissipating device(s). The external heat dissipating device(s) uses a cooling device, such as a fan, to cool the heated fluid, and the cooler fluid is then provided to the inlets 148-1 and 148-2 for recirculation into the cooling unit 302.

In the embodiment in FIG. 3B, the pumping units 102-1 and 102-2 are referred to as operating in series. Such a configuration increases throughput and may be used for cooling relatively large size integrated circuits (ICs) or other large heat generating devices. To ensure the most efficient operation of the cooling apparatus 300, the pumping units 102-1 and 102-2 may be operated at the same operating speeds.

Figure 4A:
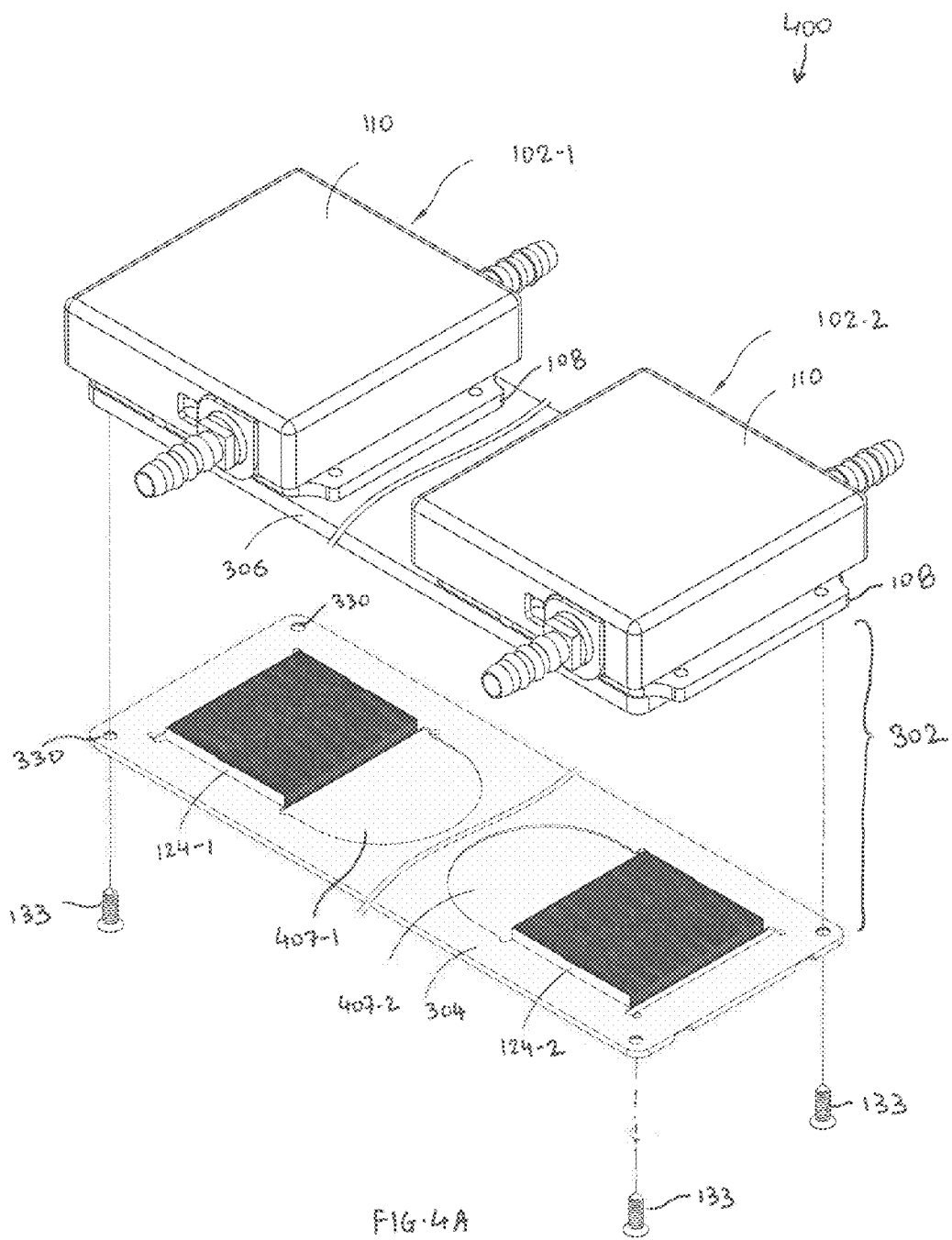
FIG. 4A illustrates a partially exploded view of yet another cooling apparatus, according to another disclosed embodiment.

FIG. 4A is a partially exploded view of a cooling apparatus 400, according to another embodiment disclosed herein. The cooling apparatus 400 may be similar in some respects to the cooling apparatus 300 in FIG. 3A, and therefore may be best understood with reference thereto where like numerals designate like components not described again in detail. In the cooling apparatus 400, the base plate 304 may not include a continuous recess between the arrays of fins 124-1 and 124-2 like the recess 307 in the cooling apparatus 300 of FIG. 3A. As illustrated, the base plate 304 may contain two recesses 407-1 and 407-2 (collectively referred to as recesses 407) that are fluidly separated from each other. In other words, fluid may not transfer between the recesses 407-1 and 407-2. The recess 407-1 may reside adjacent the array of fins 124-1 and may be in fluid communication therewith. The recess 407-2 may reside adjacent the array of fins 124-2 and may be in fluid communication therewith. In FIG. 4A, the recesses 407 are illustrated as having a semicircular shape. However, the recesses 407 are not limited to having any particular shape. Further, both recesses 407 may have the same shape or each recess 407 may have a different shape.

Figure 4B:
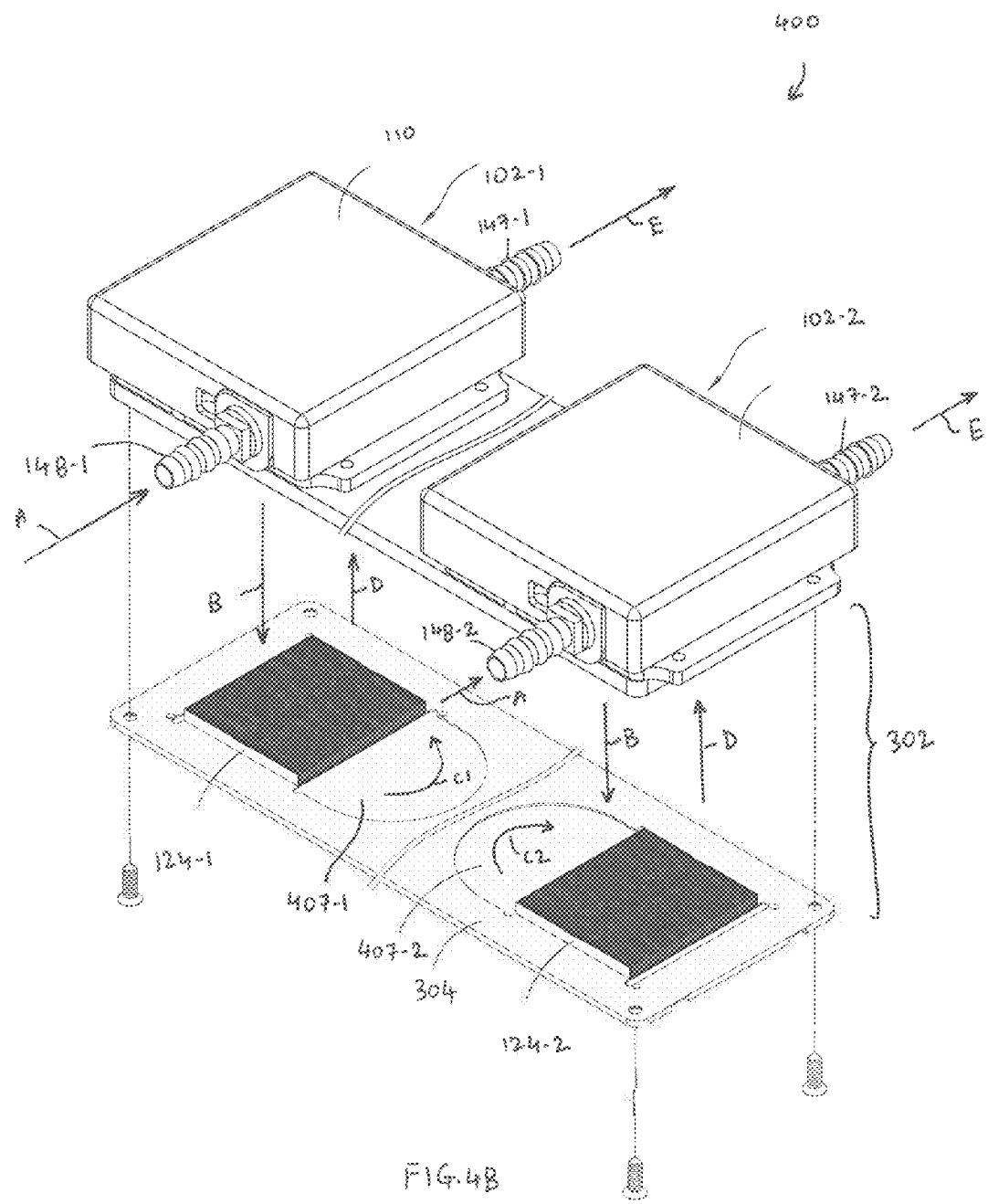
FIG. 4B illustrates a fluid flow in the cooling apparatus of FIG. 4A during operation thereof, according to disclosed embodiments.

FIG. 4B illustrates fluid flow in the cooling apparatus 400 during operation thereof, according to embodiments disclosed herein. For the sake of clarity of illustration, not all components of the cooling apparatus 400 are labelled in FIG. 4B. The operation of the cooling apparatus 400 may be similar in some respects to the operation of cooling apparatus 300 in FIG. 3B, and therefore may be best understood with reference thereto where like numerals designate like components not described again in detail.

As illustrated in FIG. 4B, relatively cooler fluid from the external heat dissipating device may enter the pumping units 102 via the respective inlets 148-1 and 148-2, as indicated by the arrows A. The cooler fluid may enter the cooling unit 302 and contacts the arrays of fins 124-1 and 124-2, as indicated by the arrows B. Inside the cooling unit 302, heat from the base plate 304 and the fins 124 is transferred to the cooler fluid and the temperature of the cooler fluid increases.

Unlike in the operation of the cooling apparatus 300, the heated fluid from the arrays of fins 124 does not mix with each other. As indicated by arrow C1, heated fluid from the array of fins 124-1 is prevented from flowing to the array of fins 124-2 due to the recess 407-1. Similarly, as indicated by arrow C2, the heated fluid from the array of fins 124-2 is prevented from flowing to the array of fins 124-1 due to the recess 407-2. The heated fluid may then enter the pumping units 102, as indcted by arrows D, and may exit the corresponding pumping units 102 via the outlets 147-1 and 147-2, as indicated by the arrows E. The heated fluid then flows to the external heat dissipating device(s) that cool the fluid using a cooling device, such as a fan. The cooler fluid is then provided to the inlets 148-1 and 148-2 for recirculation into the cooling unit 302.

Thus, in the cooling apparatus 400, fluid enters and exits from the same pumping unit 102. There is no exchange of fluid between the pumping units 102. In the embodiment in FIG. 4B, the pumping units 102-1 and 102-2 are referred to as operating in parallel. In such a configuration, each pumping unit 102 may operate at a different operating speed. Because each pumping unit 102 operates individually, the configuration (e.g., flow resistance, etc.) of the heat exchange chambers of each pumping unit 102 may be different. In an embodiment, sensors may monitor the operating conditions of each pumping unit 102 and, may communicate information regarding the operating conditions of each pumping unit 102 to a controller. Based on the information, the controller may vary the operation of the pumping units 102 so that both pumping units 102 have the same heat dissipating efficiency. For instance, the controller may vary the operating speed of one or more pumping units 102. The cooling apparatus 400 also may be used for cooling relatively large size integrated circuits (ICs) or other large heat generating devices.

FIG. 5A is a perspective view of another embodiment of a cooling apparatus 500. The cooling apparatus 500 may be similar in some respects to the cooling apparatus 100 in FIG. 1A, and therefore may be best understood with reference thereto where like numerals designate like components not described again in detail. In the assembled state of the cooling apparatus 500 illustrated in FIG. 5A, the pumping unit 102 may be vertically oriented as opposed to a horizontal orientation in the cooling apparatus 100. FIGS. 5B and 5C are different perspective views of the cooling apparatus 500 in a disassembled state.

Referring to FIGS. 5A-5C, the cooling apparatus 500 may include a cooling unit 508 coupled to the pumping unit 102. The cooling unit 508 may have a generally T-shaped body 501 having a first or "vertical" surface 513 and a second or "horizontal" surface 509 perpendicular to the first surface 513. As illustrated in FIG. 5A, the pumping unit 102 may be coupled to the cooling unit 508 via the first surface 513. The cooling unit 508 and the pumping unit 102 are secured to each other using fastening techniques discussed above. The cooling unit 508 may be sized or otherwise configured to receive (or alternatively provide a housing for) a heat sink device 502 that functions as a heat sink to remove heat from an electronic component (e.g., a central processing unit (CPU)) or other heat generating sources coupled thereto. The electronic component or any other heat generating sources may be coupled on the surface 511 of the heat sink device 502 located generally above the fins 124. A heat generating source may be coupled to the surface 511 using a thermally conductive material (e.g., thermal grease) in order to transfer the heat generated from the heat generating source to fins via the base plate 516.

Figure 5D:
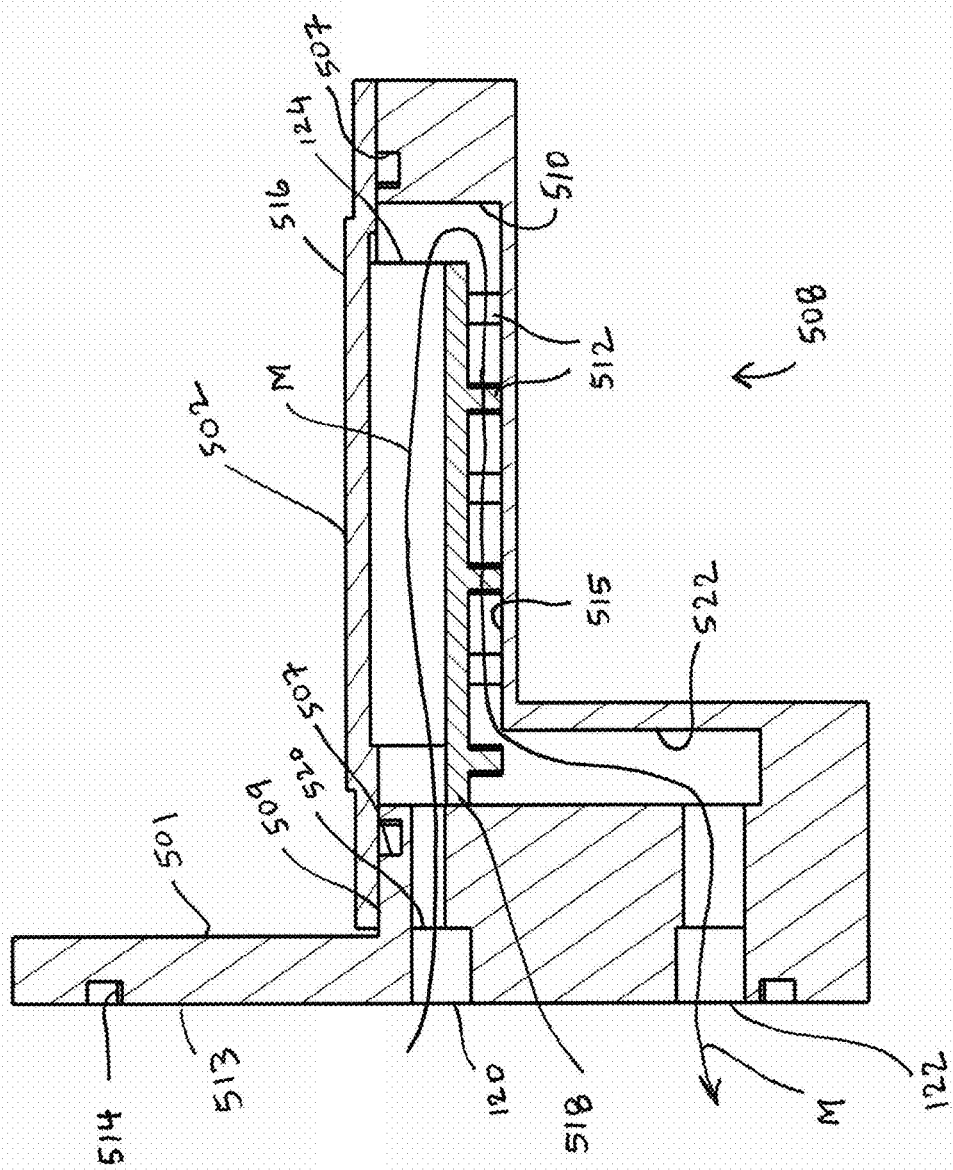
FIG. 5D is a cross-sectional view of the cooling apparatus of FIG. 5B taken along the line 5D-5D.
Figure 5E:
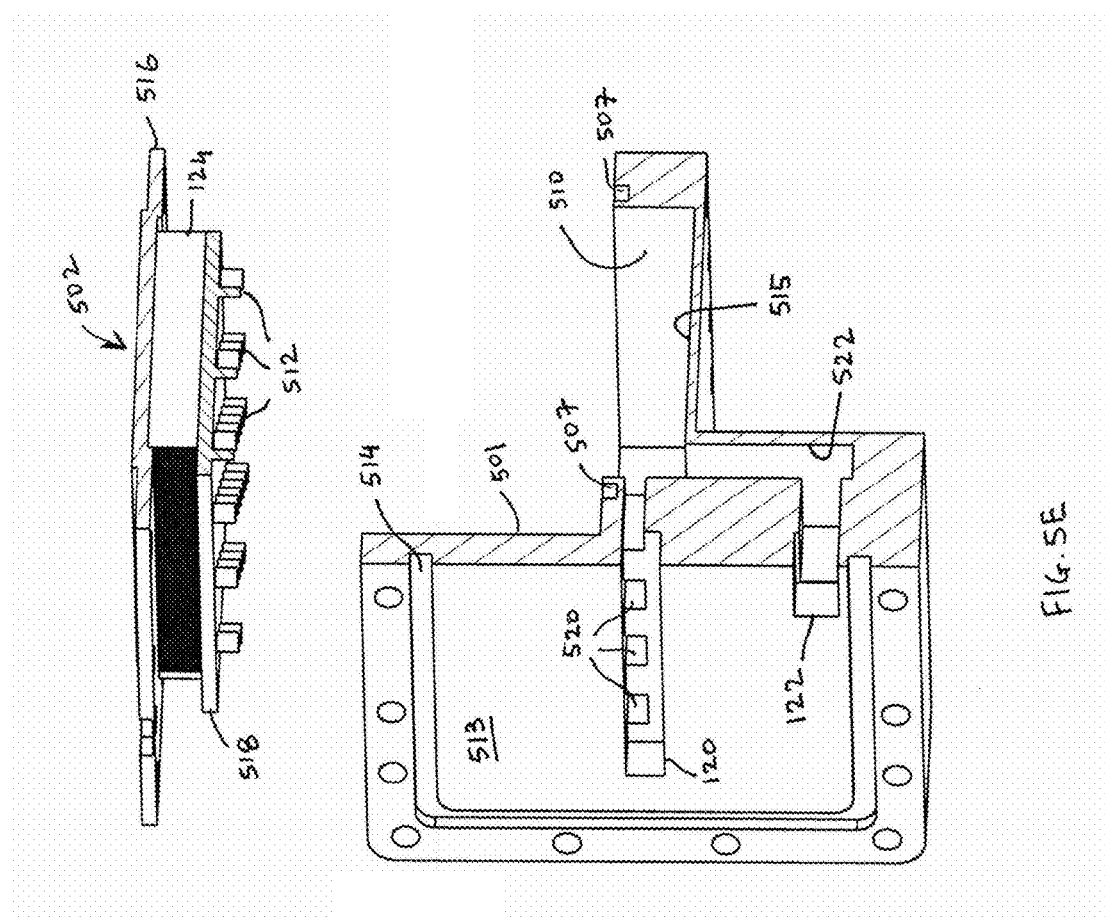
FIG. 5E is a perspective cross-sectional view of the cooling apparatus of FIG. 5B taken along the line 5D-5D.

Referring to FIG. 5B, the cooling unit 508 contains openings 120, 122 on the first surface 513 thereof. Referring to FIG. 5C, the pump housing 108 of the pumping unit 102 has openings 112, 114 that correspond to the openings 120, 122, similar to the cooling apparatus 100. FIG. 5D is a cross-sectional view of the cooling apparatus 500 taken along the line 5D-5D in FIG. 5B. FIG. 5E is a perspective cross-sectional view of the cooling apparatus 500 taken along the line 5D-5D in FIG. 5B and with the heat sink device 502 removed from the cooling unit 508. Referring to FIGS. 5D and 5E, the heat sink device 502 includes a base plate 516, a top plate 518, and the array of fins 124 disposed between the base plate 516 and the top plate 518. The body 501 of the cooling unit 508 may contain a cavity 510 in the second surface 509 that is sized or otherwise configured to receive the heat sink device 502. The heat sink device 502 also includes columns or pillars 512 extending from the top plate 518. The columns 512 support the heat sink device 502 by contacting a bottom surface 515 of the cavity 510 when the heat sink device 502 is installed in the cooling unit 508. When installed, body 501 may function similar to a cover that encloses the fins 124 that extend perpendicular to the first surface 513 of the cooling unit 508. Stated otherwise, the fins 124 and the openings 120, 122 may extend to be perpendicular to each other.

The body 501 may contain a plurality of channels 520 near the openings 120. The channels 520 fluidly connect the opening 120 with the cavity 510. The body 501 may also contain a passage 522 extending from the cavity 510 (or more specifically, from the bottom surface 515 thereof) to the opening 122 and thereby fluidly connecting the cavity 510 to the opening 122.

Referring to FIGS. 5A-5E, the heat sink device 502 may contain installation holes 505 and the cooling unit 508 may have installation holes 507 corresponding to the installation holes 505. The installation holes 505, 507 may receive fasteners, such as rivets, screws, nuts, bolts, etc. to secure the heat sink device 502 to the cooling unit 508. Additionally or alternatively, other fastening techniques, such as riveting, screwing, press-fitting, and the like, may be used to secure the heat sink device 502 to the cooling unit 508. As discussed above with reference to cooling apparatuses 100, 300, and 400, in the cooling apparatus 500, the pumping unit 102 and the cooling unit 508 may also be coupled to each other via a sealing element (similar to the sealing element 106) disposed between the pumping unit 102 and the cooling unit 508. The sealing element may be disposed in a recess 514 defined in the surface 513. For the sake of clarity of illustration, the sealing element is not illustrated in FIGS. 5B and 5C.

Figure 5F:
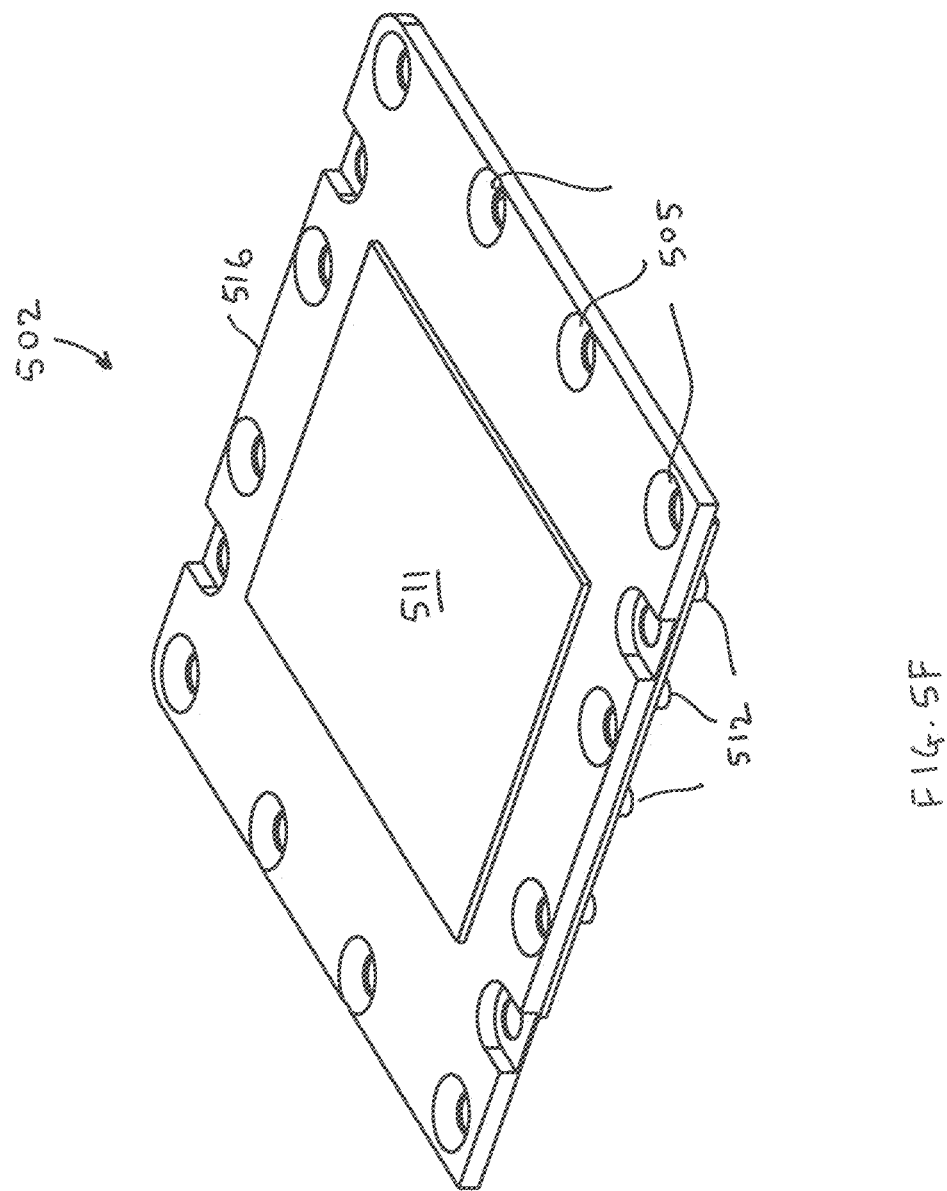
FIGS. 5F and 5G are top and bottom perspective views illustrating features of the heat sink device of the cooling apparatus of FIGS. 5A-5E, according to disclosed embodiments.
Figure 5G:
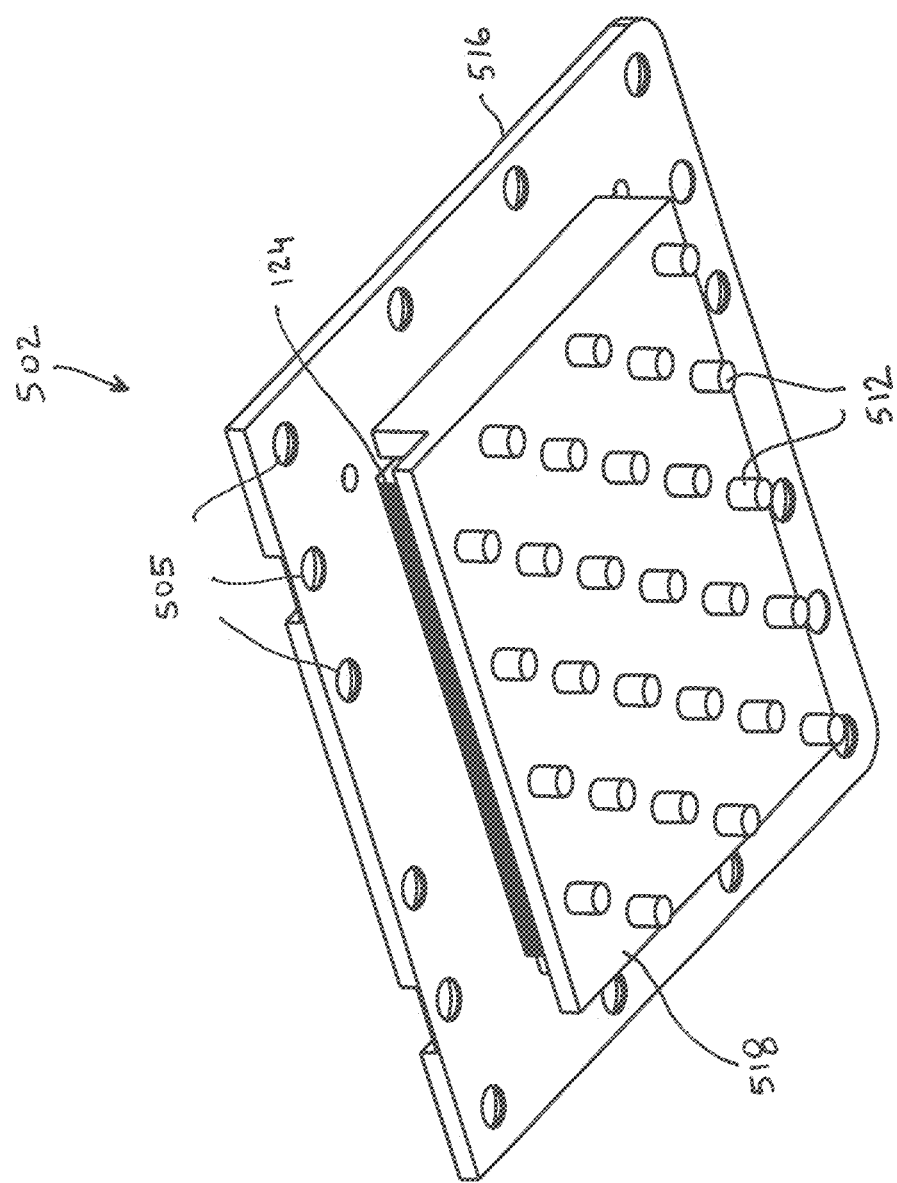

FIGS. 5F and 5G are top and bottom perspective views illustrating features of the heat sink device 502, according to embodiments disclosed herein.

Referring to FIGS. 5A-5D, during operation, relatively cooler fluid from the external heat dissipating device (e.g., a radiator or similar device) may enter the pumping unit 102 via the inlet 148. The cooler fluid may then enter the cooling unit 508 via the opening 120. The fluid may flow through the channels 520 and into the cavity 510. In the cavity 510, the heat from the base plate 516 and the fins 124 is transferred to the cooler fluid and the temperature of the cooler fluid increases.

The heated fluid then flows from underneath the fins 124, through the columns 512, and into the passage 522. The heated fluid may then exit the cooling unit 508 via the opening 122 and enter the pumping unit 102 via the opening 114. The heated fluid then may exit the pumping unit 102 via the outlet 147. The heated fluid flows to an external heat dissipating device(s) that cools the fluid using a cooling device, such as a fan. The cooler fluid is then provided to the inlet 148 for recirculation. The flow path of the fluid into and out of the cooling unit 508 is indicted by the arrow M in FIG. 5D. As seen, the flow path is generally U-shaped.

The cooling apparatus 500 provides space savings that can be used in a space restricted environment.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A cooling apparatus, comprising:
a base plate configured to dissipate heat and including two heat exchange units, at least one recess being defined in the base plate and between the two heat exchange units;
a cover coupled to the base plate and enclosing the two heat exchange units, the cover and the base plate defining a heat exchange chamber that includes the two heat exchange units, the cover defining a first set of openings and a second set of openings, and the cover being coupled to the base plate such that the first set of openings is above a first heat exchange unit and the second set of openings is above a second heat exchange unit; and
a first pumping unit disposed on the cover and over the first set of openings and a second pumping unit disposed on the cover and over the second set of openings, each of the first and second pumping units configured to circulate fluid into and out of the heat exchange chamber.

2. The cooling apparatus of claim 1, wherein
each of the two heat exchange units includes a plurality of fins,
each set of the first and second set of openings includes a first elongated slot and a second elongated slot parallel to the first elongated slot, the first and second elongated slots having different lengths, and
the cover is coupled to the base plate such that the first and second elongated slots are perpendicular to the plurality of fins.

3. The cooling apparatus of claim 2, wherein each pumping unit includes a pump housing having a bottom surface that is substantially flat and contains a first opening that is in fluid communication with the first elongated slot and a second opening that is in fluid communication with the second elongated slot.

4. The cooling apparatus of claim 1, wherein the cover and the base plate are coupled together by at least one weld.

5. The cooling apparatus of claim 1, wherein the two heat exchange units are in fluid communication with each other via the at least one recess.

6. The cooling apparatus of claim 5, wherein the at least one recess contains a first channel and a second channel fluidly isolated from the first channel, and wherein the first and second pumping units are configured to exchange at least a portion of the fluid in the heat exchange chamber with each other via the first and second channels.

7. The cooling apparatus of claim 1, wherein the at least one recess includes first and second recesses fluidly separated from each other, and the first recess is in fluid communication with a first heat exchange unit and the second recess is in fluid communication with a second heat exchange unit.

8. The cooling apparatus of claim 1, wherein the first and second pumping units operate at different operating speeds.

9. The cooling apparatus of claim 1, wherein the first and second pumping units operate at a common operating speed.

10. A method of operating a cooling apparatus, the method comprising:
receiving fluid into a first pumping unit and a second pumping unit via corresponding inlets of the first pumping unit and the second pumping unit, each pumping unit being disposed on a cover coupled to a base plate, wherein
the base plate includes two heat exchange units and contains at least one recess between the two heat exchange units,
the cover is coupled to the base plate and a heat exchange chamber is defined between the cover and the base plate and includes the two heat exchange units, the cover containing a first set of openings and a second set of openings, and the cover being coupled to the base plate such that the first set of openings is above a first heat exchange unit and the second set of openings is above a second heat exchange unit, and
a first pumping unit is disposed over the first set of openings and a second pumping unit is disposed over the second set of openings;
transferring the fluid into the heat exchange chamber via the first and second sets of openings;
transferring the fluid into the first pumping unit and the second pumping unit; and
outputting the fluid from the first pumping unit and the second pumping unit via corresponding outlets of the first pumping unit and the second pumping unit.

11. The method of claim 10, wherein the two heat exchange units are in fluid communication with each other via the at least one recess, and the method further comprises:
exchanging at least a portion of the fluid between the two heat exchanging units via the recess.

12. The method of claim 10, wherein the at least one recess includes a first recess in fluid communication with a first heat exchange unit and a second recess in fluid communication with a second heat exchange unit, and the method further comprises:
fluidly separating the fluid in the heat exchange chamber using the first and second recesses.

13. The method of claim 10, further comprising operating the first and second pumping units at different operating speeds.

14. The method of claim 10, further comprising operating the first and second pumping units at a common operating speed.

15. A cooling apparatus, comprising:

a cooling unit having a base plate configured to dissipate heat and including at least one heat exchange unit, and a cover coupled to the base plate and enclosing the at least one heat exchange unit, the cover having a first surface that is substantially flat and including a first longitudinal opening and a second longitudinal opening;

a pumping unit coupled to the cooling unit and over the first and second longitudinal openings, wherein
- the pumping unit includes a second surface that is substantially flat and contains a third longitudinal opening and a fourth longitudinal opening,
- the pumping unit is coupled to the cooling unit via the second surface and the first surface of the cover such that the third longitudinal opening is in fluid communication with the first longitudinal opening and the fourth longitudinal opening is in fluid communication with the second longitudinal opening, and
- the pumping unit is configured to output a low temperature fluid to the cooling unit and receive a high temperature fluid from the cooling unit; and a sealing element disposed between the cooling unit and the pumping unit, wherein the sealing element surrounds the first, second, third, and fourth longitudinal openings.

* * * * *